(12) United States Patent
Honda

(10) Patent No.: US 12,317,432 B2
(45) Date of Patent: May 27, 2025

(54) HOUSING AND CONTROL DEVICE

(71) Applicant: Panasonic Intellectual Property Management Co., Ltd., Osaka (JP)

(72) Inventor: Takeshi Honda, Hyogo (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 42 days.

(21) Appl. No.: 18/511,119

(22) Filed: Nov. 16, 2023

(65) Prior Publication Data

US 2024/0179856 A1  May 30, 2024

(30) Foreign Application Priority Data

Nov. 25, 2022  (JP) .................. 2022-188682

(51) Int. Cl.
*H05K 5/02* (2006.01)
*B60R 16/023* (2006.01)

(52) U.S. Cl.
CPC ........ *H05K 5/0204* (2013.01); *B60R 16/0239* (2013.01)

(58) Field of Classification Search
CPC .................................................. H05K 5/0204
See application file for complete search history.

(56) References Cited

U.S. PATENT DOCUMENTS

| | | | | |
|---|---|---|---|---|
| 4,580,861 A * | 4/1986 | Kaley | .................. | H01R 13/514 439/594 |
| 5,507,077 A * | 4/1996 | Kotajima | ............... | H02G 3/263 24/669 |
| 2003/0109150 A1 * | 6/2003 | Saka | .................. | H01R 13/5213 439/76.2 |
| 2003/0211760 A1 * | 11/2003 | Ito | ........................ | H01R 13/514 439/76.2 |
| 2003/0226679 A1 * | 12/2003 | Ito | ........................ | H01R 9/2408 174/59 |
| 2021/0305792 A1 * | 9/2021 | Ando | ..................... | H02G 3/081 |

FOREIGN PATENT DOCUMENTS

| | | | |
|---|---|---|---|
| JP | 2004-179280 | 6/2004 | |
| JP | 2015060968 A | * 3/2015 | |
| WO | WO-2018179262 A1 | * 10/2018 | ............. B60R 16/02 |

* cited by examiner

*Primary Examiner* — Hung V Ngo
(74) *Attorney, Agent, or Firm* — Greenblum & Bernstein, P.L.C.

(57) ABSTRACT

A housing that is to be attached to an object via a bracket includes: a contact surface contacted by the press-fitted bracket; a pair of projecting portions that are disposed at both sides of the contact surface in a widthwise direction along the contact surface and orthogonal to a press-fitting direction of the bracket and project out toward the bracket and extend in the press-fitting direction; a pair of clamping portions that extend toward each other from projecting edge portions of the pair of projecting portions, and clamp the bracket between the contact surface and at least a portion of the pair of clamping portions; and a stopper that abuts the bracket and prevents the bracket from being press-fitted by more than a predetermined length in the press-fitting direction. A leading end portion of each of the pair of clamping portions in the press-fitting direction and the stopper are connected.

8 Claims, 4 Drawing Sheets

HOUSING AND CONTROL DEVICE

CROSS REFERENCE TO RELATED APPLICATION

The present application is based on and claims priority of Japanese Patent Application No. 2022-188682 filed on Nov. 25, 2022.

FIELD

The present disclosure relates to a housing and a control device that includes the housing.

BACKGROUND

Conventionally, a control device that includes a housing attached via a bracket to an object, such as a vehicle is known. Patent Literature (PTL) 1 describes a bracket attachment method in which a housing made of resin includes cross-sectional L-shaped holding portions that project integrally from a surface of a housing, and a bracket is press-fitted between the pair of the holding portions that oppose each other and the surface of the housing. Furthermore, the housing is described as including stoppers that stop the bracket from being excessively pushed in during press-fitting.

CITATION LIST

Patent Literature

PTL 1: Japanese Unexamined Patent Application Publication No. 2004-179280

SUMMARY

However, the above-mentioned housing can be improved upon.

The present disclosure provides a housing and a control device that includes the housing that can further improve upon the related art.

A housing according to one aspect of the present disclosure is a housing that is to be attached to an object via a bracket, and the housing includes: a contact surface that is contacted by the bracket that has been press-fitted; a pair of projecting portions disposed at both sides of the contact surface in a widthwise direction that is along the contact surface and orthogonal to a press-fitting direction of the bracket, the pair of projecting portions projecting out toward the bracket and extending in the press-fitting direction; a pair of clamping portions that extend toward each other from projecting edge portions of the pair of projecting portions, and clamp the bracket between the contact surface and at least a portion of each one of the pair of clamping portions; and a stopper that abuts the bracket and prevents the bracket from being press-fitted by more than a predetermined length of the bracket in the press-fitting direction. A leading end portion of each one of the pair of clamping portions in the press-fitting direction and the stopper are connected to each other.

Furthermore, a control device according to one aspect of the present disclosure is a control device that is to be attached to an object via a bracket, and the control device includes: a housing that houses an electronic component, wherein the housing includes: a contact surface that is contacted by the bracket that has been press-fitted; a pair of projecting portions disposed at both sides of the contact surface in a widthwise direction that is along the contact surface and orthogonal to a press-fitting direction of the bracket, the pair of projecting portions projecting out toward the bracket and extending in the press-fitting direction; a pair of clamping portions that extend toward each other from projecting edge portions of the pair of projecting portions, and clamp the bracket between the contact surface and at least a portion of each one of the pair of clamping portions; and a stopper that abuts the bracket and prevents the bracket from being press-fitted by more than a predetermined length of the bracket in the press-fitting direction. A leading end portion of each one of the pair of clamping portions in the press-fitting direction and the stopper are connected to each other.

The housing and the control device that includes the housing according to one aspect of the present disclosure can further improve upon the related art.

BRIEF DESCRIPTION OF DRAWINGS

These and other advantages and features of the present disclosure will become apparent from the following description thereof taken in conjunction with the accompanying drawings that illustrate a specific embodiment of the present disclosure.

DESCRIPTION OF EMBODIMENTS

Hereinafter, embodiments of a housing and a control device that includes the housing according to the present disclosure will be described with reference to the drawings. It should be noted that the following embodiments are merely examples for describing the present disclosure, and are not intended to limit the scope of the present disclosure. For example, the shapes, structures, materials, elements, relative positional relationships, connection states, numerical values, formulas, and details of each of the steps and the order of the steps of the methods, and the like, described in the following embodiments are mere examples, and may include details that are not included in the following descriptions. Furthermore, although there are cases where geometric expressions, such as "parallel" and "orthogonal", are used, these expressions are not mathematically precise indications and include substantially permissible error, deviation, and the like. Moreover, expressions, such as "simultaneous" and "identical (or the same)", are considered to cover a substantially permissible range of meaning.

Additionally, the drawings are schematic illustrations, which may include emphasis, omission, or adjustment of proportion as necessary for the purpose of illustrating the present disclosure, and thus the shapes, positional relationships, and proportions shown may be different from actuality. Furthermore, an X-axis, Y-axis, and Z-axis, which may be shown in the figures indicate orthogonal coordinates that have been set in an arbitrary manner for the purpose of describing the figures. That is to say, a Z-axis is not necessarily an axis that extends in a vertical direction, and X and Y axes do not necessarily lie within a horizontal plane.

Furthermore, hereinafter, multiple aspects may be comprehensively described as a single embodiment. Moreover, part of the contents in the description below describes optional elements related to the present disclosure.

Figure 1:
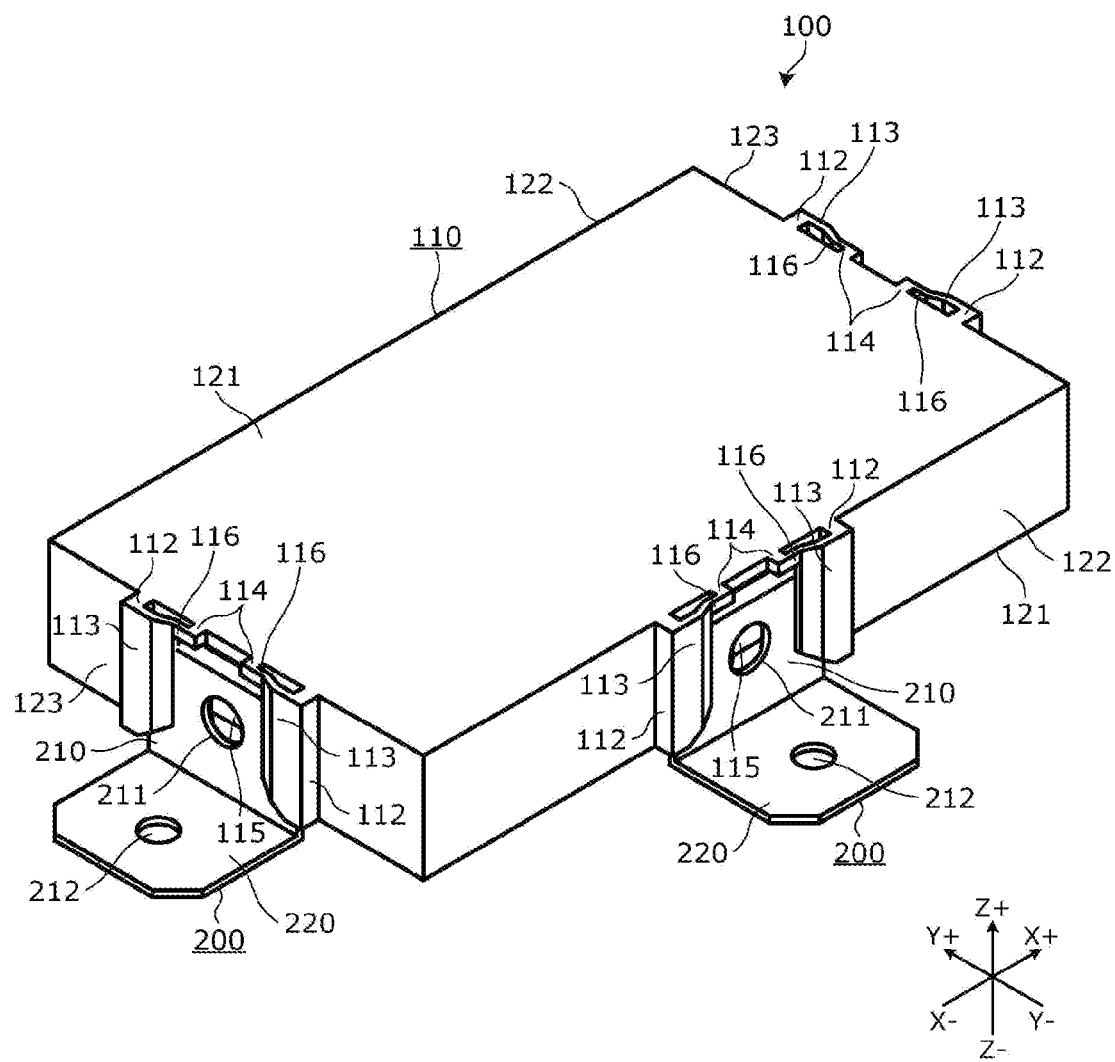
FIG. 1 is a perspective view illustrating a control device in which brackets have been press-fitted to a housing.
Figure 2:
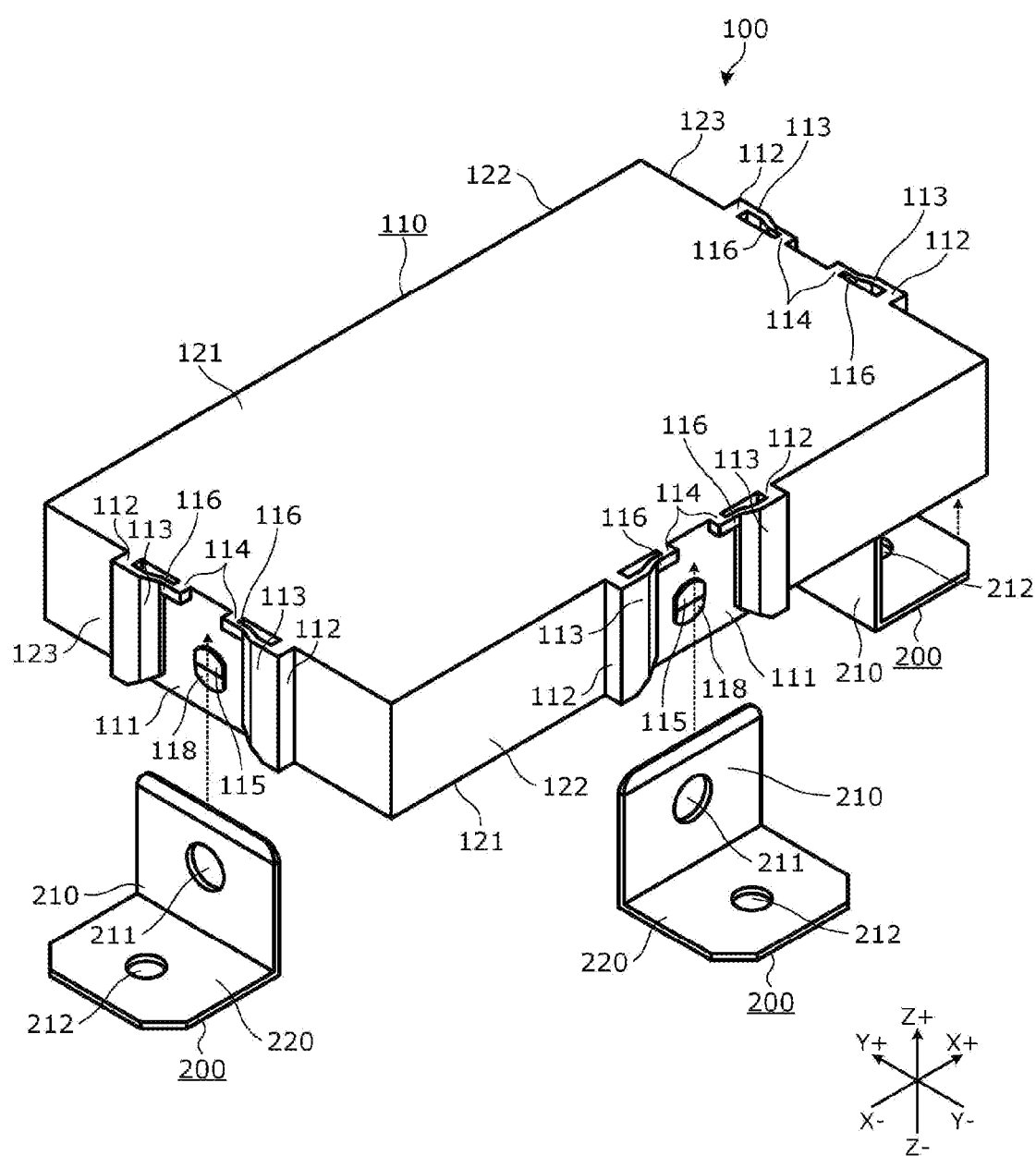
FIG. 2 is a perspective view illustrating the brackets and the control device before press-fitting is performed.

FIG. 1 is a perspective view illustrating control device 100 in which brackets 200 have been press-fitted to housing 110. FIG. 2 is a perspective view illustrating brackets 200 and control device 100 before press-fitting is performed.

Brackets 200 are components used to attach control device 100 to an object by fastening a portion of a bracket 200 to housing 110 of control device 100, and fastening another portion of the bracket 200 to the object. The shape and material of brackets 200 are not particularly limited, and in the present embodiment, brackets 200 are plate-shaped components made of metal that have been formed by bending the components into an L-shape. First surface 210 and second surface 220 included in each bracket 200 are provided with first hole 211 and second hole 212, respectively. First hole 211 and second hole 212 penetrate through in the thickness direction of the respective surfaces. First hole 211 functions to engage bracket 200 with engagement protrusion 115 (later described in detail) included in housing 110, and prevent bracket 200 from detaching from housing 110. Second hole 212 functions to fasten bracket 200 to the object, by having a fastening component, such as a bolt or a rivet, passed through second hole 212.

Control device 100 is a device that is attached to the object via brackets 200, and includes housing 110 that houses electronic components (not illustrated in the figures). Specific examples of the object include moving bodies, such as automobiles, aircraft, and marine vessels. An example of control device 100 is an electronic control unit (ECU) that electronically controls all or part of the functions of the object.

Housing 110 is a box-shaped resin component that is attached to the object via brackets 200, and includes contact surfaces 111, projecting portions 112, clamping portions 113, and stoppers 114. In the present embodiment, housing 110 includes engagement protrusions 115. Inside of housing 110 included in control device 100 a circuit board (ECU) composed of a printed substrate on which electronic components are mounted, for example, is attached in a fixed manner.

The approximate external shape of housing 110 is not particularly limited, and may be a shape, such as a rectangular cuboid, cylinder, or the like. Housing 110 includes a lid that can be opened and closed, and may be capable of maintaining its inside in a sealed state, or may have a state where the outside and inside of housing 110 communicate with each other. In the present embodiment, housing 110 is approximately rectangular-cuboid shaped, and includes a pair of main surfaces 121 that have the largest area, a pair of first side surfaces 122 that have the next largest area, and a pair of second side surfaces 123 that have the smallest area.

Examples of the material of housing 110 include acrylonitrile butadiene styrene (ABS), ABS containing polycarbonate (PC) as an additive, acrylonitrile styrene acrylate (ASA), styrene acrylonitrile (SAN), and polypropylene (PP). Furthermore, glass fiber, and the like, may be included as a reinforcing material. Moreover, the material that housing 110 is composed of may be adjusted to have an elasticity appropriate for snap fitting by being neither too hard nor too soft. Specific elasticity may, for example, be 2,000 MPa to 2,500 MPa. This elasticity may be achieved by adjusting the amount of additives, such as butadiene, acrylate rubber, and the like.

Figure 3:
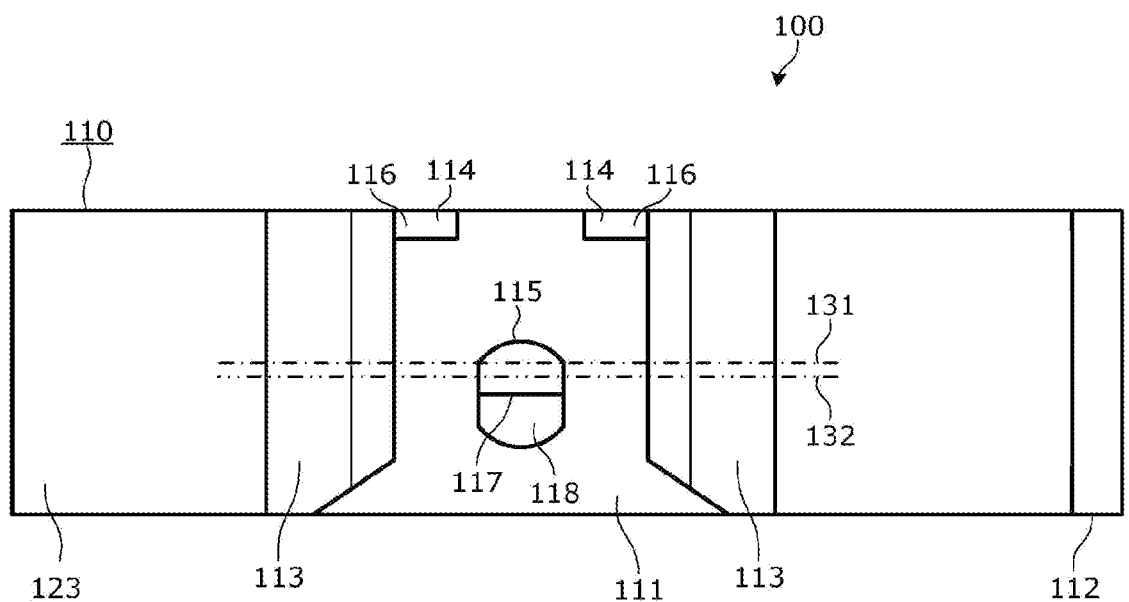
FIG. 3 is a side view illustrating a second side surface of the housing before attachment of a bracket.
Figure 3:
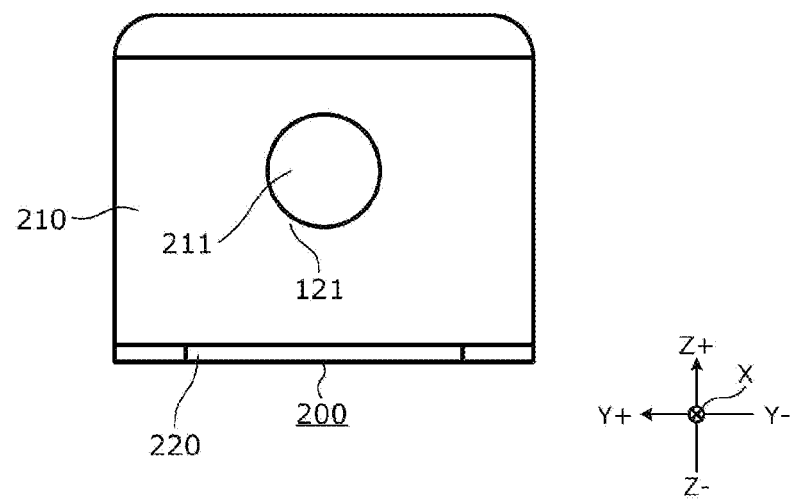

FIG. 3 is a side view illustrating second side surface 123 of housing 110 before attachment of bracket 200. Contact surface 111 is a portion of housing 110 on which first surface 210 of the bracket 200 being press-fitted slides across, and is contacted by press-fitted bracket 200. In the present embodiment, one contact surface 111 is provided on each second side surface 123 and on one first side surface 122 of housing 110, and each contact surface 111 is flush with the respective side surface.

Projecting portions 112 are a pair of elongated protruding portions disposed at both sides of contact surface 111 in a widthwise direction (X-axis or Y-axis direction in the figures) that is along contact surface 111 and orthogonal to a press-fitting direction (Z-axis direction in the figures) of bracket 200. The pair of projecting portions 112 project out toward bracket 200 and extend in the press-fitting direction. In the present embodiment, projecting portions 112 are rectangular cuboid in shape, and rise perpendicularly along the side surfaces of housing 110, and have a length in the press-fitting direction identical to that of the side surfaces of housing 110.

Clamping portions 113 are tongue-shaped portions that extend toward each other from projecting edge portions (edge portions that are farthest from the outer surface of housing 110) of the pair of projecting portions 112, and clamp first surface 210 of bracket 200 between contact surface 111 and at least a portion of each clamping portion 113. Specifically, clamping portions 113 are cantilever plate components that project in the widthwise direction from the projecting edge portions of projecting portions 112, and are disposed apart from each other by a predetermined distance of contact surface 111.

The pair of clamping portions 113, the pair of projecting portions 112, and a pair of portions of contact surface 111 form grooves that extend in the press-fitting direction and include openings disposed across from each other in the widthwise direction. The grooves formed by clamping portions 113, projecting portions 112, and contact surface 111 include openings at the base end in the press-fitting direction, at which bracket 200 is inserted, and bracket 200 is press-fitted into the pairs of grooves disposed across from each other, from the openings at the base end. In the present embodiment, the leading end of each groove in the press-fitting direction also has an opening, and the groove formed by clamping portion 113, projecting portion 112, and a portion of contact surface 111 penetrates through in the press-fitting direction. Accordingly, the structural elastic force of clamping portion 113 can be made to be lower than when the leading end of the groove is sealed. At least a portion of the gap between clamping portion 113 and contact surface 111 is less than the thickness of first surface 210 of bracket 200. Accordingly, first surface 210 of the bracket 200 that has been press-fitted between contact surface 111 and clamping portion 113 is clamped by clamping portion 113 and contact surface 111.

In the present embodiment, in a portion toward the leading end of clamping portion 113 in the widthwise direction, the leading edge is angled to approach contact surface 111. The edge of clamping portion 113 that is farther from stopper 114 (edge on the Z− side in the figures) is chamfered to approach stopper 114 in the press-fitting direction with distance in the widthwise direction from the corresponding projecting portion 112. Although the base edge of clamping portion 113 connected to projecting portion 112 is the same length as projecting portion 112, since the leading edge of clamping portion 113 is shorter than the base edge of clamping portion 113, the structural elastic force of clamping portion 113 is lower than when chamfering is not performed. By performing chamfering on the base end portion of clamping portion 113 in the press-fitting direction, the elastic force of clamping portion 113 can be arbitrarily set by adjusting the chamfering angle during the design phase. Furthermore, by performing chamfering on clamping portion 113, first surface 210 of bracket 200 can more easily be inserted between clamping portion 113 and contact surface 111 when press-fitting is performed.

Stopper 114 is a stopper that abuts bracket 200 and prevents bracket 200 from being press-fitted by more than a predetermined length of bracket 200 at a predetermined position in the press-fitting direction. Stopper 114 is an end portion toward the leading end of clamping portion 113 (Z+ side in the figures) in the press-fitting direction, that is disposed between a pair of clamping portions 113, and projects out from the outer surface of housing 110 toward first surface 210 of the bracket 200 being press-fitted. Although the shape of stopper 114 is not particularly limited, in the present embodiment, stopper 114 is rectangular-cuboid shaped, and two stoppers 114 are disposed between a pair of clamping portions 113. It should be noted that there may be only one stopper 114 or three or more stoppers 114 disposed between a pair of projecting portions 112.

The projecting end portion of stopper 114 and the leading end portion (end portion on the Z+ side in the figures) of clamping portion 113 in the press-fitting direction are connected to each other. Furthermore, the base end portion of stopper 114 and clamping portion 113 are connected via a portion of projecting portion 112 and a portion of housing 110. In other words, stopper 114, a portion of clamping portion 113, a portion of projecting portion 112, and a portion of housing 110 are connected in a loop-like manner. Accordingly, stopper 114 can be structurally strengthened, and stopper 114 can be made to structurally withstand a force that matches or exceeds the regulated pressure applied by first surface 210 of bracket 200 when press-fitting is performed, thereby preventing stopper 114 itself from being destroyed. In particular, when the thickness of stopper 114 in the press-fitting direction is restricted, such as when stopper 114 is disposed to be flush with the outer surface (one of main surfaces 121) of housing 110, and an increased press-fitting length is desired for first surface 210 of bracket 200, the effect of improving structural strength can be enhanced by joining together stopper 114 and clamping portion 113.

In the present embodiment, stopper 114 and clamping portion 113 are connected via connecting portion 116 that extends in the widthwise direction. By connecting stopper 114 and clamping portion 113 in a bridge-like manner using connecting portion 116, the elastic force of clamping portion can be arbitrarily set by adjusting the length of connecting portion 116 during the design phase.

Engagement protrusion 115 is a protrusion that engages with first hole 211 provided in first surface 210 of the press-fitted bracket 200, and by mating with first hole 211 provided in first surface 210, prevents the press-fitted bracket 200 from becoming detached from housing 110. Engagement protrusion 115 projects from contact surface 111 between the pair of clamping portions 113 out toward first surface 210 of bracket 200. In the present embodiment, the base end side of engagement protrusion 115 in the press-fitting direction includes slope 118 that slopes upward toward the leading end side of engagement protrusion 115. When first surface 210 of bracket 200 is being press-fitted, first surface 210 is guided by slope 118, and temporarily lifts off of contact surface 111. As first surface 210 is press-fitted even further, engagement protrusion 115 becomes mated with first hole 211, and first surface 210 abuts contact surface 111, thereby causing clamping first surface 210 to be clamped between contact surface 111 and clamping portion 113.

As illustrated in FIG. 3, engagement edge portion 117 (edge on the Z− side in the figures) of the outermost projecting portion of engagement protrusion 115 that is farther from stopper 114 is disposed farther away (Z− side in the figures) from stopper 114, in the press-fitting direction, than first position 131, which is the midpoint of projecting portion 112, is. In the present embodiment, engagement edge portion 117 is disposed closer to the base end side in the press-fitting direction than second position 132, which is the midpoint between the base end portion of projecting portion 112 and the base end portion of stopper 114 in the press-fitting direction, is. By setting the position at which first surface 210 slides up onto engagement protrusion 115, during press-fitting of first surface 210 of bracket 200, farther away from connecting portion 116 that connects stopper 114 and clamping portion 113, it is possible to decrease the amount of force applied to first surface 210 by clamping portion 113 during press-fitting.

According to housing 110 of control device 100 of the embodiment, by integrally connecting stopper 114 and clamping portion 113, the press-fitting load of bracket 200 can be inhibited from increasing, while improving the structural strength of stopper 114. In particular, the fracture strength of stopper 114 in the press-fitting direction can be improved.

For example, the control value of the press-fitting load of bracket 200 at a control device 100 production plant is set to be between the load at which press-fitting is possible (maximum value when there is variation) and the fracture load of stopper 114 (minimum value when there is variation). According to housing 110 of the embodiment, since the fracture load of stopper 114 is higher than when the projecting end of stopper 114 is not connected to clamping portion 113, a wider range of press-fitting loads can be selected during process control. For example, by increasing the press-fitting load, time spent on performing press-fitting of bracket 200 can be reduced, thereby increasing productivity to produce control device 100.

It should be noted that the present disclosure is not limited to the above embodiment. For example, other embodiments produced by arbitrarily combining or omitting some elements described in the present Description may be included as embodiments of the present disclosure. Moreover, the present disclosure includes variations obtained by various modifications to the above embodiment that can be conceived by those skilled in the art, so long as they do not depart from the essence of the present disclosure, that is, the intended meaning of the appended Claims.

Figure 4:
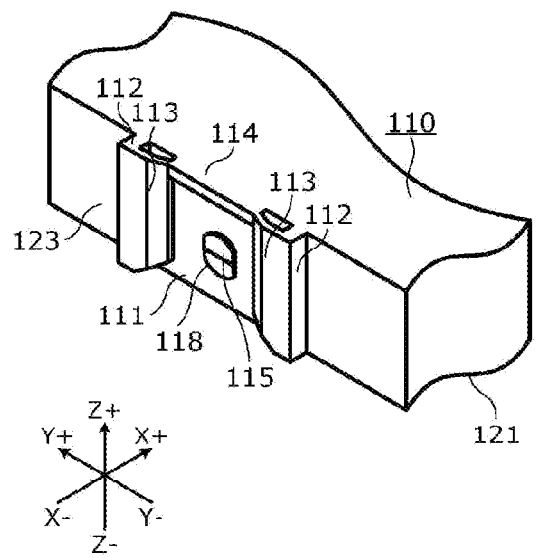
FIG. 4 is a perspective view illustrating Example 1 of the housing.

For example, as illustrated in FIG. 4, a single stopper 114 may be disposed between a pair of clamping portions 113. Furthermore, the single stopper 114 may be connected to each of the pair of clamping portions 113 disposed on both ends of stopper 114 in a widthwise direction. Additionally, stopper 114 may be directly connected to clamping portions 113 without mediation through connecting portions 116.

Figure 5:
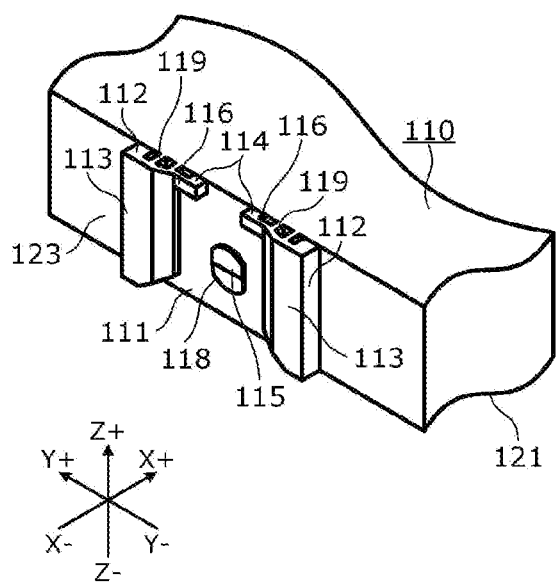
FIG. 5 is a perspective view of Example 2 of the housing.

Furthermore, as illustrated in FIG. 5, the structural elastic force of clamping portions 113 may be adjusted by providing reinforcing portions 119 that connect clamping portions 113 and contact surface 111 at portions of the leading end side of the grooves formed by clamping portions 113, projecting portions 112, and contact surface 111.

Further Information about Technical Background to this Application

The disclosure of the following patent application including specification, drawings, and claims are incorporated herein by reference in its entirety: Japanese Patent Application No. 2022-188682 filed on Nov. 25, 2022.

The invention claimed is:

1. A housing that is to be attached to an object via a bracket, the housing comprising:
   a contact surface that is contacted by the bracket that has been press-fitted;
   a pair of projecting portions disposed at both sides of the contact surface in a widthwise direction that is along the contact surface and orthogonal to a press-fitting direction of the bracket, the pair of projecting portions projecting out toward the bracket and extending in the press-fitting direction;
   a pair of clamping portions that extend toward each other from projecting edge portions of the pair of projecting portions, and clamp the bracket between the contact surface and at least a portion of each one of the pair of clamping portions; and
   a stopper that abuts the bracket and prevents the bracket from being press-fitted by more than a predetermined length of the bracket in the press-fitting direction, wherein
   a leading end portion of each one of the pair of clamping portions in the press-fitting direction and the stopper are connected to each other.

2. The housing according to claim 1, wherein
   the leading end portion of each one of the pair of clamping portions in the press-fitting direction and the stopper are connected to each other via a connecting portion that extends in the widthwise direction.

3. The housing according to claim 1, wherein
   an edge of each one of the pair of clamping portions that is farther from the stopper approaches the stopper with distance from a corresponding one of the pair of projecting portions.

4. The housing according to claim 1, further comprising:
   an engagement protrusion that projects from the contact surface between the pair of clamping portions, the engagement protrusion engaging with a hole provided in the bracket, wherein
   an edge of an outermost projecting portion of the engagement protrusion that is farther from the stopper is disposed farther away from the stopper, in the press-fitting direction, than a midpoint of the pair of projecting portions is.

5. The housing according to claim 1, wherein
   a material of the housing includes at least one of acrylonitrile butadiene styrene (ABS), acrylonitrile styrene acrylate (ASA), styrene acrylonitrile (SAN), or polypropylene (PP).

6. The housing according to claim 5, wherein
   the material includes a reinforcing material.

7. The housing according to claim 1, wherein
   elasticity of at least the pair of clamping portions is selected from a range of from 2,000 MPa to 2,500 MPa, inclusive.

8. A control device that is to be attached to an object via a bracket, the control device comprising:
   a housing that houses an electronic component, wherein the housing includes:
      a contact surface that is contacted by the bracket that has been press-fitted;
      a pair of projecting portions disposed at both sides of the contact surface in a widthwise direction that is along the contact surface and orthogonal to a press-fitting direction of the bracket, the pair of projecting portions projecting out toward the bracket and extending in the press-fitting direction;
      a pair of clamping portions that extend toward each other from projecting edge portions of the pair of projecting portions, and clamp the bracket between the contact surface and at least a portion of each one of the pair of clamping portions; and
      a stopper that abuts the bracket and prevents the bracket from being press-fitted by more than a predetermined length of the bracket in the press-fitting direction, wherein
      a leading end portion of each one of the pair of clamping portions in the press-fitting direction and the stopper are connected to each other.

* * * * *